United States Patent
Kimura et al.

(10) Patent No.: US 12,394,679 B2
(45) Date of Patent: Aug. 19, 2025

(54) LID BODY, ELECTRONIC COMPONENT ACCOMMODATION PACKAGE, AND ELECTRONIC DEVICE

(71) Applicant: KYOCERA Corporation, Kyoto (JP)

(72) Inventors: Takayuki Kimura, Omihachiman (JP); Hisaki Masuda, Hikone (JP); Yuko Tanaka, Kyoto (JP); Takayuki Ohyama, Higashine (JP); Yoshihiro Uemura, Moriyama (JP); Hiroyuki Miura, Helsinki (FI)

(73) Assignee: KYOCERA Corporation, Kyoto (JP)

( * ) Notice: Subject to any disclaimer, the term of this patent is extended or adjusted under 35 U.S.C. 154(b) by 571 days.

(21) Appl. No.: 17/763,352

(22) PCT Filed: Sep. 30, 2020

(86) PCT No.: PCT/JP2020/037188
§ 371 (c)(1),
(2) Date: Mar. 24, 2022

(87) PCT Pub. No.: WO2021/066024
PCT Pub. Date: Apr. 8, 2021

(65) Prior Publication Data
US 2022/0344226 A1    Oct. 27, 2022

(30) Foreign Application Priority Data
Sep. 30, 2019  (JP) ................. 2019-178705

(51) Int. Cl.
*H01L 23/06*    (2006.01)
*H01L 23/00*    (2006.01)

(52) U.S. Cl.
CPC .............. *H01L 23/06* (2013.01); *H01L 24/29* (2013.01); *H01L 2224/29139* (2013.01);
(Continued)

(58) Field of Classification Search
CPC ....... H01L 23/04; H01L 23/562; H01L 23/06; H01L 24/29; H01L 23/10; H01L 23/053;
(Continued)

(56) References Cited

U.S. PATENT DOCUMENTS

2004/0023487 A1    2/2004  Shiomi et al.
2009/0301749 A1*  12/2009  Tanaka ................ H01L 21/4817
                                                          228/208
(Continued)

FOREIGN PATENT DOCUMENTS

| JP | 3850787 B2 | 11/2006 |
| JP | 4071191 B2 | 4/2008 |
| JP | 2017-011237 A | 1/2017 |

*Primary Examiner* — Mouloucoulaye Inoussa
(74) *Attorney, Agent, or Firm* — Volpe Koenig

(57) ABSTRACT

A lid body includes a base containing an alloy of iron and nickel, a first film positioned on a lower surface of the base and containing nickel, and a second film positioned on a lower surface of the first film and containing copper. During welding of the lid body, penetration of crystal grain boundaries of the base by Cu of the second film is reduced by the first film. Therefore, occurrence of cracks in the base is reduced and thus a package with high airtightness can be formed.

13 Claims, 3 Drawing Sheets

(52) U.S. Cl.
CPC ............... *H01L 2224/29147* (2013.01); *H01L 2224/83447* (2013.01); *H01L 2224/83455* (2013.01)

(58) Field of Classification Search
CPC ................ H01L 23/02; H01L 21/4817; H01L 2224/83447; H01L 2224/83455; H01L 2224/29147; H01L 2224/29139; H01L 2924/0002; H01L 2924/16152; H01L 2224/16; H01L 2924/01028; H01L 2924/0132; H01L 2924/16195; C22C 38/18; C22C 38/52; C22C 38/40; B23K 35/3086; B23K 35/3006; B23K 1/0008; B23K 1/0016; B23K 20/04; B23K 1/20; B23K 2101/12; B23K 2101/40; B32B 15/015; B32B 15/018; B32B 15/01; H03H 9/02; H03H 9/02984; H03H 9/1064; H03H 9/64; H03H 9/02149; H03H 9/1021; H03H 9/10; H03H 9/1071; H03H 3/02; H03H 9/133; H03H 9/0514; H05K 5/03; H05K 5/066; B65D 65/02; B65D 25/10; B65D 65/38; B65D 85/70; B81B 7/0077; Y10T 428/12896; Y10T 428/12931; Y10T 428/12944; Y10T 428/1291; H10N 30/883; H10N 30/02; C25D 5/48; C25D 7/0621; H01M 50/109; H01M 50/169; H01M 50/159; H01M 50/30; H01M 50/593; H01M 50/202; H01M 50/282; H01M 50/103; H01M 50/186; H01M 50/11; H01M 50/298; H01M 2220/30; Y02E 60/10

See application file for complete search history.

(56) References Cited

U.S. PATENT DOCUMENTS

| | | | |
|---|---|---|---|
| 2014/0226308 A1* | 8/2014 | Fukuda | F21V 31/005 362/267 |
| 2014/0291010 A1* | 10/2014 | Chiba | G01P 15/0802 29/592.1 |
| 2015/0098171 A1* | 4/2015 | Nagatomo | B23K 31/02 361/679.01 |
| 2015/0232244 A1* | 8/2015 | Yokota | B65D 65/02 428/673 |
| 2017/0330811 A1* | 11/2017 | Yokota | C25D 5/48 |
| 2017/0354049 A1* | 12/2017 | Yokota | H03H 9/10 |
| 2017/0367205 A1* | 12/2017 | Yokota | C22C 38/18 |
| 2018/0090405 A1* | 3/2018 | Yamamoto | H01L 23/057 |
| 2018/0374767 A1* | 12/2018 | Takeoka | H03H 9/02 |
| 2021/0265226 A1* | 8/2021 | Kimura | H01L 23/053 |
| 2023/0268591 A1* | 8/2023 | Nakamoto | H01M 50/109 429/163 |

* cited by examiner

US 12,394,679 B2

LID BODY, ELECTRONIC COMPONENT ACCOMMODATION PACKAGE, AND ELECTRONIC DEVICE

TECHNICAL FIELD

The present disclosure relates to a lid body, an electronic component accommodation package, and an electronic device.

BACKGROUND ART

In the related art, a lid body formed by laminating a Ni film, a Kov base, a Cu film, and a AgCu film (brazing material) in this order is disclosed as an electronic component accommodation package for mounting an electronic component such as a semiconductor element or a piezoelectric element (PTL 1).

Further, a lid body including a Cu—Ni alloy film in place of the above-described Cu film is disclosed (PTL 2).

CITATION LIST

Patent Literature

PTL 1: Japanese Patent No. 3850787
PTL 2: Japanese Patent No. 4071191

SUMMARY OF INVENTION

A lid body according to the present disclosure includes a base which contains an alloy of iron and nickel, a first film which is positioned on a lower surface of the base and which contains nickel, and a second film which is positioned on a lower surface of the first film and which contains copper.

An electronic component accommodation package according to the present disclosure includes the lid body and a base for mounting an electronic component which includes a base portion having an upper surface provided with a mounting portion on which an electronic component is to be mounted, and a frame portion which is positioned on the upper surface of the base portion, which surrounds the mounting portion, and to which a lower surface of the lid body is to be bonded.

An electronic device according to the present disclosure includes the electronic component accommodation package and an electronic component mounted on the mounting portion.

DESCRIPTION OF EMBODIMENTS

Hereinafter, embodiments of the present disclosure will be described in detail with reference to the drawings. The surface of a lid body facing the inside of a package will be denoted as "lower surface", and the opposite surface, i.e., the surface facing the outside, will be denoted as "upper surface", although these terms do not specify the vertical direction during the use of a lid body, an electronic component accommodation package, and an electronic device. Further, "thickness" denotes the length in a direction perpendicular to the upper surface of the lid body in a cross section perpendicular to the upper surface. The cross section is a cross section of a part excluding the edge of the lid body, where variations in shape are likely to occur. In a case where the lid body includes a structure other than the fourth film on the upper portion thereof, the upper surface denotes the upper surface of the fourth film from which the structure is removed. <Electronic Component Accommodation Package and Electronic Device>

Figure 1:
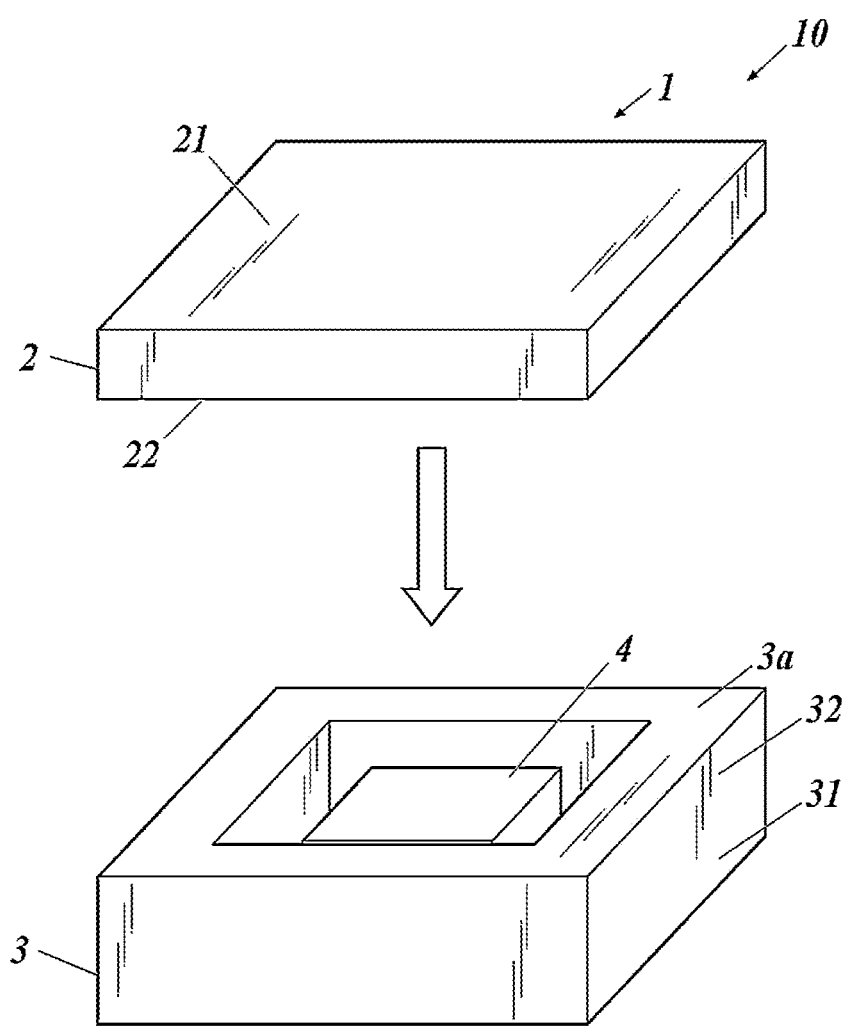
FIG. 1 is a perspective view showing an electronic device according to an embodiment of the present invention. Here, a lid body is shown in a separated state.

As shown in FIG. 1, an electronic component accommodation package 1 according to the present embodiment includes a lid body 2 and a base 3 for mounting an electronic component.

The lid body 2 has a flat plate shape and has an upper surface 21 and a lower surface 22. The lid body 2 includes a base 20, a first film 22a, and a second film 22b. The first film 22a is positioned on a lower surface Sb of the base 20. Further, the second film 22b is positioned on a first lower surface S1 of the first film 22a. Further, the lid body 2 may include a third film 22c positioned on a second lower surface S2 of the second film 22b or a bonding material 29 positioned on the second lower surface S2 of the second film 22b. Further, in a case where the third film 22c is positioned on the second lower surface S2 of the second film 22a, the bonding material 29 may be positioned on a third lower surface S3 of the third film 22c. A fourth film 21a may be positioned on an upper surface Sa of the base 20.

The base 20 contains an alloy of iron and nickel. Here, the alloy of iron and nickel is, for example, Kovar (Fe—Ni—Co-based alloy). The weight ratio of the components of Kovar is not limited as long as the ratio is in conformity with the international standard ASMT-F15. For example, the weight ratio of the components of Kovar is 53% to 54% iron (Fe), 29% nickel (Ni), and 17% cobalt (Co). Here, Kovar may also contain trace amounts of silicon (Si), manganese (Mn), and the like. In addition, the base 20 may be formed of Alloy 42 (FE-Ni42). In this case, the weight ratio of Alloy 42 is 42% Ni and 57% Fe, and Alloy 42 contains trace amounts of other metals such as copper (Cu) and manganese (Mn). Further, the ratios of the components described above may have some manufacturing errors. In addition, the thickness of the base 20 is, for example, in a range of 0.02 to 4 mm.

The first film 22a is a metal film containing nickel. Further, the first film 22a is, for example, formed mainly of nickel and may contain trace amounts of impurities. The thickness of the first film 22a is, for example, in a range of 0.002 mm to 0.02 mm.

The second film 22b is a metal film containing copper (Cu). Further, the second film 22b is, for example, formed mainly of copper and may contain trace amounts of impurities. The thickness of the second film 22b is, for example, in a range of 0.01 to 1 mm.

The third film 22c is a metal film containing nickel. Further, the third film 22c is, for example, formed mainly of nickel and may contain trace amounts of impurities. The thickness of the third film 22c is, for example, in a range of 0.002 mm to 0.02 mm.

The fourth film 21a is a metal film containing nickel. Further, the fourth film 21a is, for example, formed mainly of nickel and may contain trace amounts of impurities. The thickness of the fourth film 21a is, for example, in a range of 0.002 mm to 0.02 mm.

The bonding material 29 is a material for bonding the lid body 2 to the base 3 for mounting an electronic component described below. The bonding material 29 contains copper and silver (Ag). Here, the bonding material 29 contains, for example, a silver-copper brazing material. Alternatively, as described below, the bonding material 29 may be a low-melting-point brazing material formed of Au—Sn, a lead-free solder formed of Sn—Ag—Cu, or the like. Further, the thickness of the bonding material 29 is, for example, in a range of 0.05 to 0.5 mm. The bonding material 29 is not limited as long as the material is capable of bonding metal materials to each other. Further, the melting point of the bonding material 29 is approximately 780° C. in a case where Ag:Cu=72:28 and is approximately 850° C. in a case where Ag:Cu=85:15. The melting point can be appropriately selected according to the other configuration and the thickness. In the example shown in FIG. 2 or FIG. 3, the lid body 2 includes a Kov base 20 as a base containing Kovar, which is an alloy of iron and nickel, and a Ni film (fourth film) 21a positioned on the upper surface Sa of the Kov base 20.

Figure 2:
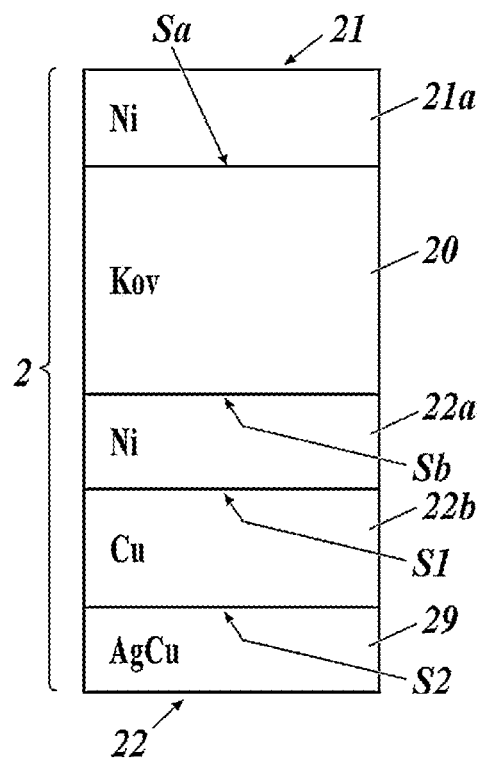
FIG. 2 is a cross-sectional view of an example of the layers of the lid body shown in FIG. 1.

Further, as shown in FIG. 2, the lid body 2 includes, as an example of the lower surface laminated structure of the Kov base 20, a Ni film (first film) 22a positioned on the lower surface Sb of the Kov base 20 and a Cu film (second film) 22b positioned on the lower surface of the Ni film 22a.

Further, the lid body 2 includes a AgCu film 29 as the bonding material positioned on the lower surface of the Cu film 22b.

The base 3 for mounting an electronic component includes a base portion 31 and a frame portion 32. The base 3 for mounting an electronic component may be in the form of a one-piece container including the base portion 31 and the frame portion 32 or in the form of a container in which the base portion 31 and the frame portion 32 are separate parts. The base portion 31 has an upper surface provided with a mounting portion for an electronic component, on which an electronic component 4 is to be mounted. Further, the frame portion 32 is positioned so as to surround the mounting portion, and the lower surface of the lid body 2 is to be bonded to the base portion 31. In addition, the base portion 31 has wiring for routing electrodes of the electronic component 4. More specifically, as shown in FIG. 1, the electronic component 4 is mounted on the mounting portion for the electronic component 4 inside the base 3 for mounting an electronic component. An outer peripheral portion (the surface on which the AgCu film 29 is disposed) of the lower surface 22 of the lid body 2 is bonded to an outer peripheral portion 3a of the upper surface of the base 3 for mounting an electronic component, and they are welded together using the AgCu film 29 as a brazing material by seam welding, direct seam welding, heating using a baking furnace, or the like. In this manner, the electronic device 10 is configured such that the electronic component 4 is sealed airtight in the electronic component accommodation package 1. Further, a predetermined metal film is formed on the outer peripheral portion 3a of the upper surface before welding, as necessary (depending on the type of the base material).

The base 3 for mounting an electronic component is a plate-like member having a rectangular shape when viewed in plan view. The base 3 may be formed of an insulating material, for example, a ceramic material such as an aluminum oxide sintered body, a mullite sintered body, a silicon carbide sintered body, an aluminum nitride sintered body, a silicon nitride sintered body, or a glass ceramic. The base 3 for mounting an electronic component is not limited to those formed of such ceramic materials. The material of the base 3 for mounting an electronic component may contain, for example, a resin material, such as an epoxy resin, a polyimide resin, or a polyamide resin, or a composite material obtained by adding glass cloth, an inorganic filler, or the like to such resin materials. The size of the base 3 for mounting an electronic component is, for example, in a range of 5 mm×5 mm to 50 mm×50 mm in plan view and the thickness thereof is in a range of 0.3 mm to 3 mm. Further, in a case where the base 3 for mounting an electronic component contains a metal material, a structure from which heat generated by the electronic component 4 is efficiently released to the outside of the package 1 can be obtained.

The inner edge and the outer edge of the frame portion 32 each have a rectangular frame shape in plan view. Each side of the frame portion 32 in the rectangular frame shape is provided parallel to the corresponding side of the base 3 for mounting an electronic component. Further, the frame portion 32 may have a metal layer on the upper surface thereof, which is the surface facing the lid body 2. Further, in a case where the frame portion 32 is provided integrally with the upper surface of the base 3 for mounting an electronic component, the frame portion 32 formed of a ceramic material may be provided by being baked simultaneously with the base 3 for mounting an electronic component. Further, in a case where the frame portion 32 and the base portion 31 are separately provided, the metal layer positioned on the upper surface of the base 3 for mounting an electronic component and the metal layer positioned on the lower surface of the frame portion 32 may be bonded to each other with a bonding material such as a low-melting-point brazing material formed of gold (Au)-tin (Sn).

In addition, a metal material such as iron, copper, nickel, chromium, cobalt, or tungsten or an alloy formed of such metals can be used as the frame portion 32. The size of the frame portion 32 is, for example, in a range of 5 mm×5 mm to 50 mm×50 mm and the thickness thereof is in a range of 0.5 mm to 2 mm in plan view. Further, the height of the frame portion 32 is, for example, in a range of 1 mm to 10 mm.

The lid body 2 is bonded to the upper surface of the frame portion 32 by using a bonding material such as a brazing material or solder such that the inside of the frame portion 32 is blocked. The lid body 2 has a rectangular shape in plan view, and has a bonding region to be bonded to the upper surface of the frame portion 32 that is the surface facing the lid body 2 is provided on the lower surface of the lid body 2 that is the surface facing the frame portion 32.

With the above-described configuration, the electronic component accommodation package 1 according to the embodiment of the present invention described above is capable of satisfactorily maintaining the package in a sealed state.

The electronic device 10 according to the embodiment of the present disclosure is completed by installing the electronic component 4 in an installation region of the electronic component accommodation package 1 described above and electrically connecting the electronic component 4 to a first electrode portion of the electronic component accommodation package 1. The electronic component 4 is installed on the metal portion provided in the installation region by using a bonding material such as a low-melting-point brazing material formed of Au-Sn or a lead-free solder formed of Sn-silver (Ag)-copper (Cu). Examples of the electronic component 4 include ICs, LSIs, and semiconductor elements for power devices.

Further, the electronic component 4 is sealed in the electronic device 10 by bonding and fixing the lid body 2 to the upper surface of the frame portion 32 as a lid in a state where the electronic component 4 is mounted (installed) on the mounting portion. Here, the upper surface of the frame portion 32 and the bonding region of the lid body 2 are bonded to each other with an adhesive or an adhesive containing the bonding material 29. The adhesive is, for example, silver-copper, as described above, or another material such as a low-melting-point brazing material formed of Au—Sn or a lead-free solder formed of Sn—Ag—Cu.

Figure 3:
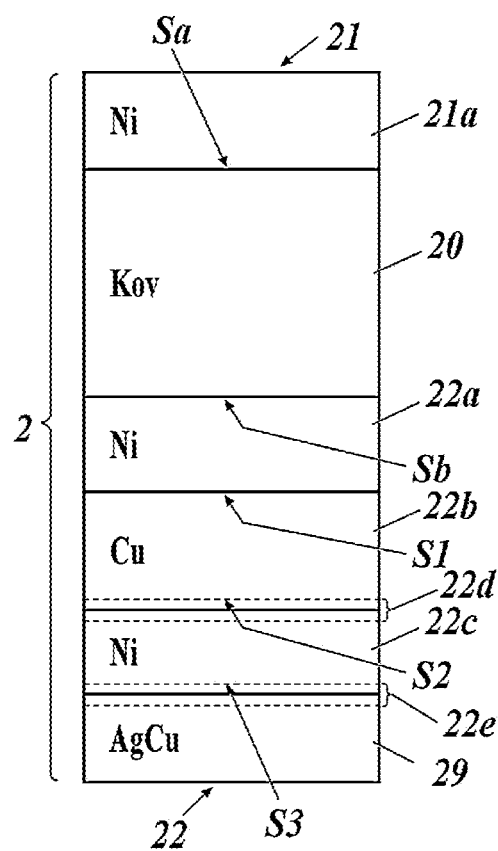
FIG. 3 is a cross-sectional view of another example of the layers of the lid body shown in FIG. 1.

In a case where the frame portion 32 of the electronic component accommodation package 1 and the lid body 2 are bonded to each other with the bonding material 29, the bonding is carried out by a seam welding method or the like. In this case, heat is locally applied to the lid body 2, which tends to cause thermal expansion and thermal contraction. As shown in FIG. 2, an alloy film is formed between the second film 22b and the bonding material 29 in a case where the bonding material 29 is bonded to the second film 22b of the lid body 2. The alloy film is formed of an alloy of copper and silver. Here, penetration of the crystal grain boundaries of the base 20 by Cu of the second film 22b and AgCu of the bonding material 29 is reduced because the first film 22a is positioned between the base 20 and the second film 22b. Further, in a case where the third film 22c is provided in the lid body 2 as shown in FIG. 3, a first alloy film 22d is generated between the second film 22b and the third film 22c due to the heat during welding. In this manner, the possibility of the material of the second film 22b coupling with the material of the bonding material 29 due to the heat during bonding can be reduced. Therefore, the possibility of variations in the melting point of the bonding material 29 can be reduced, and unevenness in bonding during welding due to variations in the melting point of the bonding material 29 can also be reduced. Further, in a case where the bonding material 29 contains silver and copper and the third film 22c is formed of a metal, such as nickel, a second alloy film 22e containing silver, copper, and nickel is easily generated. Accordingly, the possibility of the material of the second film 22b coupling with the material of the bonding material 29 due to the heat during bonding can be reduced as described above. The first alloy film 22d may be positioned partially or entirely between the second film 22b and the third film 22c. In a case where the first alloy film 22d is positioned entirely between the second film 22b and the third film 22c, the possibility of the material of the second film 22b coupling with the material of the bonding material 29 due to the heat during bonding can be further reduced. The second alloy film 22e may be positioned partially or entirely between the third film 22c and the bonding material 29. In a case where the second alloy film 22e is positioned entirely between the third film 22c and the bonding material 29, the possibility of the material of the second film 22b coupling with the material of the bonding material 29 due to the heat during bonding can be further reduced.

Further, the first film (22a) and the fourth film (21a) may be formed of identical materials. In this case, since the upper and lower layers of the base 20 can be sandwiched between the materials with an identical thermal expansion coefficient, deformation and warpage of the base 20 due to the heat and the like generated during welding of the lid body 2 can be reduced. Here, "identical materials" includes materials containing different impurities and materials containing different amounts of impurities within a range where the impurities do not affect thermal expansion. Further, in a case where the thickness of the first film 22a is identical to the thickness of the fourth film 21a, since the upper and lower layers of the base 20 can be sandwiched with similar thermal expansion, deformation and warpage of the base 20 due to the heat and the like generated during welding of the lid body 2 can be further reduced. Here, "identical" may include errors during measurement of the thickness, manufacturing errors, and the like. For example, in a case where the thickness of the fourth film 21a is within ±10% of the thickness of the first film 22a, the thickness of the fourth film 21a can be considered to be identical to the thickness of the first film 22a.

Further, the thickness of the second film 22b may be greater than each of the thickness of the first film 22a, the thickness of the third film 22c, and the thickness of the fourth film 21a. The second film 22b contains copper and thus has a lower elastic modulus than in other configurations. Therefore, the amount of deformation of the lid body 2 due to the thermal stress can be further reduced by increasing the thickness of the second film 22b in a case of applying heat during bonding of the lid body 2 to the base 3 for mounting an electronic component. Accordingly, in a case of carrying out welding or the like, the lid body 2 can be bonded to the base 3 for mounting an electronic component with a lower pressure. As a result, the load applied to the base 3 for mounting an electronic component can be reduced. In this manner, the possibility of mechanical loss, such as cracks, occurring in the lid body 2 and the base 3 for mounting an electronic component can be reduced.

Further, the third film 22c and the first film 22a may be formed of identical materials. In this case, since the upper and lower layers of the second film 22b can be sandwiched between the materials with an identical thermal expansion coefficient, deformation and warpage of the second film 22b due to the heat and the like generated during welding of the lid body 2 can be reduced. Here, "identical materials" includes materials containing different impurities and materials containing different amounts of impurities within a range where the impurities do not affect thermal expansion. Further, in a case where the thickness of the first film 22a is identical to the thickness of the third film 22c, since the upper and lower layers of the second film 22b can be sandwiched with similar thermal expansion, deformation and warpage of the second film 22b due to the heat and the like generated during welding of the lid body 2 can be further reduced. Here, "identical" may include errors during the measurement of the thickness, manufacturing errors, and the like. For example, in a case where the thickness of the third film 22c is within ±10% of the thickness of the first film 22a, the thickness of the third film 22c can be considered to be identical to the thickness of the first film 22a.

Further, as described above, the first alloy film 22d is formed between the third film 22c and the second film 22b with the heat generated during bonding of the lid body 2 to the base 3 for mounting an electronic component. Therefore, the thickness of the third film 22c of the lid body 2 bonded to the base 3 for mounting an electronic component may be less than the thickness of the first film 22a.

<Production Method>

Hereinafter, a method of producing the electronic component accommodation package 1 according to the embodiment of the present disclosure will be described.

In a case where the base portion 31 of the base 3 for mounting an electronic component is formed of an aluminum oxide sintered body, the base portion 31 is prepared in the following manner. First, ceramic green sheets are prepared in a rectangular sheet shape by forming a raw material powder, such as aluminum oxide or silicon oxide, into a sheet shape together with an appropriate organic binder and an appropriate organic solvent. Next, a laminate composed of the ceramic green sheets is prepared by laminating a plurality of ceramic green sheets. Further, a plurality of ceramic green sheets are not necessarily laminated to obtain a laminate, and the laminate may be formed of only one layer as long as there is no problem in terms of mechanical strength and the like as the base portion 31 of the base 3 for mounting an electronic component. Thereafter, these ceramic green sheets are baked at a temperature of 1300° C. to 1600° C., thereby preparing the base portion 31 of the base 3 for mounting an electronic component.

In a case where the frame portion 32 is formed of, for example, an aluminum oxide sintered body, the frame portion 32 is prepared in the same manner as for the base 3 for mounting an electronic component described above. First, ceramic green sheets are prepared in a rectangular sheet shape by forming a raw material powder, such as aluminum oxide or silicon oxide, into a sheet shape together with an appropriate organic binder and an appropriate organic solvent. Next, a laminate composed of the ceramic green sheet is prepared by laminating a plurality of ceramic green sheets. Further, the laminate is formed into a frame shape by providing a through-hole in the central portion according to a punch working method. In addition, a metal layer is provided on the upper surface of the laminate by printing a metal paste prepared by mixing a powder of tungsten, an organic solvent, and an organic binder by using a method, such as a screen printing method. Thereafter, the frame portion 32 is obtained by baking the laminate at a temperature of 1300° C. to 1600° C. Further, the frame portion 32 is not necessarily formed by laminating a plurality of ceramic green sheets and may be formed of only one layer as long as there is no problem in terms of mechanical strength and the like as the frame portion 32. Further, the frame portion 32 is bonded to the upper surface of the base 3 for mounting an electronic component with a bonding material such as a glass bonding material or a resin bonding material. In a case where the frame portion 32 is formed of an aluminum oxide sintered body similar to that of the base 3 for mounting an electronic component, the frame portion 32 is formed integrally with the base portion 31 by a method of laminating frame-like ceramic green sheets on the upper surface of ceramic green sheets for forming the base 3 for mounting an electronic component and simultaneously baking these ceramic green sheets.

The lid body 2 is formed by stacking together the base and the respective films, performing pressure bonding with a pressure bonding machine to form a clad material, and processing the clad material to a predetermined size. In this case, the thickness of each configuration to be prepared is determined in advance in consideration of the compression ratio of each material so that the lid body 2 has a predetermined thickness. Alternatively, an iron-nickel-cobalt alloy and nickel, and nickel and copper, are pressure-bonded to form a clad material, the clad material is processed to a predetermined size, and the upper surface and the lower surface of the clad material are subjected to nickel plating.

The penetration of the crystal grain boundaries of the Kov base 20 by Cu of the Cu film 22b and AgCu of the AgCu film 29 during welding of the lid body 2 and the base 3 for mounting an electronic component is reduced by the Ni film 22a. Therefore, occurrence of cracks in the Kov base 20 is reduced, and thus a package with high airtightness can be formed.

The lid body 2 may include, as another example of the lower surface laminated structure of the Kov base 20, as shown in FIG. 3, the Ni film 22a positioned on the lower surface Sb of the Kov base 20, the Cu film 22b positioned on the lower surface of the Ni film 22a, and the Ni film (third film) 22c positioned on the lower surface of the Cu film 22b.

Further, the lid body 2 may include the AgCu film 29 as the bonding material positioned on the lower surface of the Ni film 22c.

In a case of such a laminated structure, the penetration of the Kov base 20 by Cu and AgCu as described above can be reduced, and the possibility of Cu of the Cu film 22b coupling with Cu of the AgCu film 29 due to heat during welding can be reduced because the Ni film 22c is interposed between the Cu film 22b and the AgCu film 29. In this manner, the possibility of a change in the melting point of the AgCu film 29, which functions as a coupling material, due to the Cu film 22b coupling with the AgCu film 29 when heat is applied can be reduced, compared with a case where the Ni film 22c is not provided.

Therefore, the bonding reliability of the lid body 2 is stabilized by stabilizing the melting point of the bonding material (29) and occurrence of cracks in the Kov base 20 is reduced, and thus a package with high airtightness can be formed.

The AgCu film 29 shown in FIGS. 2 and 3 bonds the lid body 2 to the base 3 for mounting an electronic component in the electronic device 10. The AgCu film 29 may be positioned as a part of the lid body 2 or may be positioned on the outer peripheral portion 3a of the upper surface of the base 3 for mounting an electronic component. Further, the AgCu film 29 may be separately positioned between the base 3 for mounting an electronic component and the lid body 2. By disposing the AgCu film 29 on the lid body in advance, the labor of separately preparing the bonding material can be reduced in a case where the lid body 2 is bonded as a lid body for a semiconductor device package or the like, and thus productivity can be improved. The bonding material may be a low-melting-point brazing material formed of Au—Sn, a lead-free solder formed of Sn—Ag—Cu, or the like, in place of the AgCu film 29.

Figure 4A:
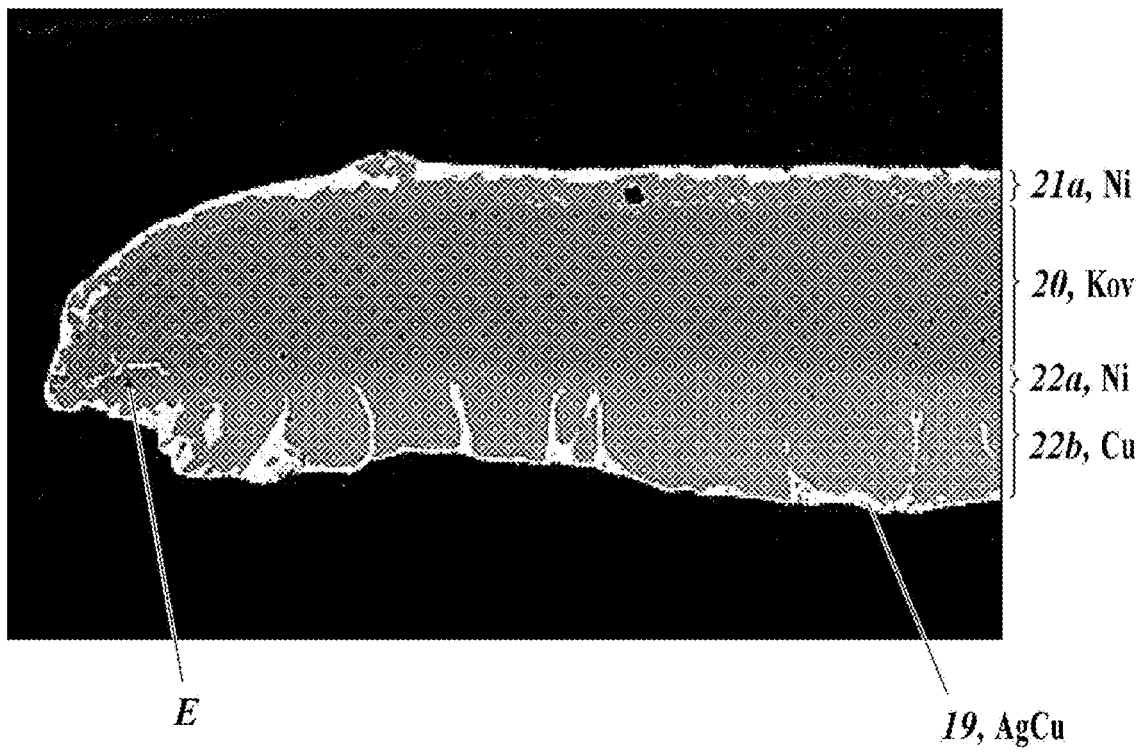
FIG. 4A is a photograph of a cross section of a lid body according to the present example.
Figure 4B:
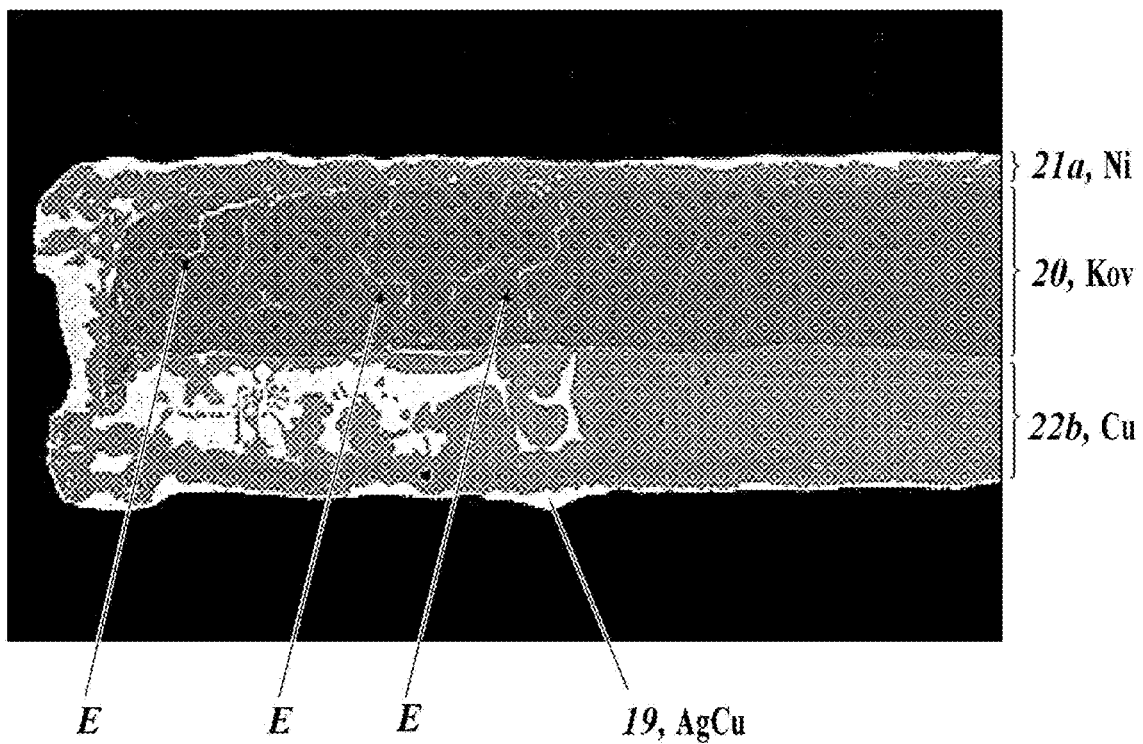
FIG. 4B is a photograph of a cross section of a lid body according to a comparative example.

FIG. 4A is a photograph of a cross section of a lid body of the present example according to the embodiment shown in FIG. 2. FIG. 4B is a photograph of a cross section of a lid body of a comparative example. Both lid bodies of the present example and the comparative example were obtained by being baked in a baking furnace at 850° C. for approximately 3.6 minutes.

In the present example shown in FIG. 4A, the Ni film 22a is interposed between the Kov base 20 and the Cu film 22b.

Meanwhile, in the comparative example shown in FIG. 4B, the Cu film 22b is in contact with the Kov base 20. Further, in the comparative example shown in FIG. 4B, the laminated elements corresponding to those of the example according to the present invention are denoted by the same reference numerals.

In the comparative example, Cu of the Cu film 22b and AgCu of the AgCu film 29 penetrate the crystal grain boundaries of the Kov base 20. Eroded parts E were confirmed in FIG. 4B. The formation of the eroded parts E is the cause of occurrence of cracks in the Kov base 20.

In contrast, in the example of the present invention, penetration of the crystal grain boundaries of the Kov base 20 by Cu of the Cu film 22b and AgCu of the AgCu film 29 is reduced by the Ni film 22a. As shown in FIG. 4A, a significant decrease in the amount of the eroded parts E in the Kov base 20 compared with the comparative example was confirmed. In this manner, occurrence of cracks in the Kov base 20 is reduced, and thus a package with high airtightness can be formed.

Further, the lid body 2 may be positioned at least in the bonding region that is bonded to the electronic component accommodation package 1. Here, the lid body 2 may have a flat plate shape or a shape in which the lid body 2 has a recess in the central portion. In this manner, thermal deformation, a change in the melting point of the bonding material, and the like during bonding of the lid body 2 to the electronic component accommodation package 1 can be efficiently reduced.

The embodiments of the present disclosure have been described above. However, the present disclosure is not limited to the above-described embodiments. For example, the details shown in the embodiments and the drawings, such as the materials, the shapes, the sizes, and the like of the respective portions of the lid body and the base for mounting an electronic component, can be appropriately changed without departing from the scope of the disclosure.

INDUSTRIAL APPLICABILITY

The present disclosure can be applied to lid bodies, electronic component accommodation packages, and electronic devices.

REFERENCE SIGNS LIST 1 electronic component accommodation package
2 lid body
3 base for mounting electronic component
3a outer peripheral portion of upper surface
4 electronic component
10 electronic device
20 Kov base (base)
21a Ni film (fourth film)
22a Ni film (first film)
22b Cu film (second film)
22c Ni film (third film)
AgCu film (bonding material)
Sa upper surface of Kov base
Sb lower surface of Kov base
S1 first lower surface
S2 second lower surface
S3 third lower surface

The invention claimed is:
1. A lid body comprising:
a base layer of the lid body that contains an alloy of iron and nickel;
a first film formed on a lower surface of the base layer, wherein the first film contains nickel; and
a second film formed on a first lower surface of the first film, wherein the second film contains copper,
wherein the lid body is configured to contact a frame portion of a base and cover a cavity formed in the base by the frame portion.
2. The lid body according to claim 1, further comprising a bonding material that is formed on a second lower surface of the second film.
3. The lid body according to claim 1, further comprising a third film that is formed on a second lower surface of the second film and which contains nickel.
4. The lid body according to claim 3, further comprising a bonding material formed on a third lower surface of the third film.
5. The lid body according to claim 2, wherein the bonding material contains copper and silver.
6. The lid body according to claim 1, further comprising a fourth film formed on an upper surface of the base layer, wherein the fourth film contains nickel.
7. The lid body according to claim 6, wherein the first film and the fourth film are formed of an identical material.
8. The lid body according to claim 3, wherein a first alloy film containing copper and nickel is formed between the second film and the third film.
9. The lid body according to claim 1, wherein the second film has a thickness greater than a thickness of the first film.
10. The lid body according to claim 6, wherein the first film has a thickness identical to a thickness of the fourth film.
11. The lid body according to claim 3, wherein the first film and the third film are formed of an identical material.
12. An electronic component accommodation package comprising:
the lid body according to claim 1; and
the base, wherein the base includes a base portion having an upper surface provided with a mounting portion on which an electronic component is to be mounted, and
wherein the frame portion is positioned on the upper surface of the base portion and the mounting portion is located in the cavity.
13. An electronic device comprising the electronic component accommodation package according to claim 12 and an electronic component mounted on the mounting portion.

* * * * *